United States Patent [19]

Lebowitz

[11] Patent Number: 4,694,561
[45] Date of Patent: Sep. 22, 1987

[54] METHOD OF MAKING HIGH-PERFORMANCE TRENCH CAPACITORS FOR DRAM CELLS

[75] Inventor: Joseph Lebowitz, Watchung; William T. Lynch, Summit, both of N.J.

[73] Assignee: American Telephone and Telegraph Company, AT&T Bell Laboratories, Murray Hill, N.J.

[21] Appl. No.: 676,677

[22] Filed: Nov. 30, 1984

[51] Int. Cl.⁴ .................... H01L 21/72; H01L 21/385
[52] U.S. Cl. ............................ 437/52; 148/DIG. 109; 437/59; 437/60; 437/225
[58] Field of Search ................ 148/187, 188, DIG. 8; 29/580, 577 C, 571; 357/42, 51, 55; 156/578, 643, 654

[56] References Cited

U.S. PATENT DOCUMENTS

| | | | |
|---|---|---|---|
| 3,387,286 | 6/1968 | Dennard | 340/173 |
| 3,928,095 | 12/1975 | Harigaya et al. | 148/190 |
| 3,969,746 | 7/1976 | Kendall et al. | 136/255 |
| 4,063,967 | 12/1977 | Graul et al. | 148/1.5 |
| 4,219,368 | 8/1980 | David | 136/89 MS |
| 4,274,892 | 6/1981 | Templin | 148/188 |
| 4,471,524 | 9/1984 | Kinsbron et al. | 29/571 |
| 4,472,212 | 9/1984 | Kinsbron | 148/188 |
| 4,523,369 | 6/1985 | Nogakubo | 29/580 |

FOREIGN PATENT DOCUMENTS 28942  6/1982  Japan ................................ 148/188

OTHER PUBLICATIONS

Minegishi et al, "A Submicron CMOS Megabit Level Dynamic RAM Technology Using Doped Face Trench Capacitor Cell", IEDM Tech. DIG. pp. 319-322, 1983.
Morie et al, "Depletion Trench Capacitor Cell", Extended Abstracts of the 15th Conference on Solid State Devices and Materials, Tokyo, 1983, pp. 253-256.
Ghandi, *VLST Fabrication Principles*, John Wiley & Sons, New York, 1983, p. 323.
Nakajima et al, "A Submicrometer Megabit DRAM Process Technology Using Trench Capacitors", IEEE Transactions on Electron Devices, vol. ED-32, 2, 2/85.
"The Hi-C RAM Cell Concept", A. F. Tasch, *IEEE Transactions on Electron Devices*, vol. ED-25, No. 1, Jan. 1978, pp. 33-41.
"Depletion Trench Capacitor Technology for Megabit Level MOS DRAM", T. Morie et al, *IEEE Electron Device Letters*, vol. EDL-4, No. 11, Nov. 1983, pp. 411-414.

*Primary Examiner*—Brian E. Hearn
*Assistant Examiner*—Tom Thomas
*Attorney, Agent, or Firm*—Lucian C. Canepa

[57] ABSTRACT

A trench version of a high-capacitance (Hi-C) capacitor for a dynamic random-access-memory (DRAM) cell is made utilizing a modified version of the doping technique described in U.S. Pat. No. 4,471,524 and 4,472,212. A shallow highly doped trench region is thereby formed. At the same time, selected lateral surface portions of the structure are also thereby highly doped. These surface portions permit a direct electrical connection to be easily made between the capacitor and a subsequently formed adjacent access transistor.

1 Claim, 11 Drawing Figures

METHOD OF MAKING HIGH-PERFORMANCE TRENCH CAPACITORS FOR DRAM CELLS

BACKGROUND OF THE INVENTION

This invention relates to dynamic random-access-memory (DRAM) arrays made in very-large-scale-integrated (VLSI) form and, more particularly, to a high-performance VLSI DRAM cell that includes a trench capacitor of the high-capacitance (Hi-C) type.

As the trend toward further miniaturization of VLSI DRAM arrays continues, considerable efforts are being directed at trying to reduce the area of the basic memory cell from which the arrays are formed. One such common cell configuration known in the art comprises a single transistor and an associated capacitor, as described, for example in U.S. Pat. No. 3,387,286.

In practice, the surface area of conventional planar-type capacitors included in VLSI DRAM memory cells has been reduced to the point where the charge capacity of such a small-area capacitor barely exceeds the charge levels produced by noise mechanisms such as those attributable to alpha particles. Even planar capacitors of the so-called Hi-C type do not satisfy some of the current design requirements specified for increasingly small-area VLSI DRAM memory cells. (See, for example, "The Hi-C RAM Cell Concept" by A. F. Tasch et al, *IEEE Transactions on Electron Devices*, Vol. Ed-25, No. 1, January 1978, pages 33–41, for a description of a planar Hi-C memory capacitor.)

In order to realize specified values of capacitance in relatively small-surface-area capacitors, proposals have been recently made for fabricating each cell capacitor as a vertical structure that extends into the substrate of the semiconductor chip in which the VLSI DRAM memory is formed. This so-called trench capacitor design has a major portion of its plates extending into rather than along the surface of the chip. The amount of surface area required per capacitor is only the area of the trench at the surface of the chip. (An article entitled "Depletion Trench Capacitor Technology for Megabit Level MOS dRAM" by T. Morie et al, *IEEE Electron Device Letters*, Vol. EDL-4, No. 11, November 1983, pages 411–414, contains a description of a memory capacitor of the trench type.)

Many motivations exist for desiring to make VLSI DRAM trench capacitors in Hi-C form analogous to the Hi-C capacitors used in planar structures. The capacitance-to-chip surface area ratio of a Hi-C trench capacitor is high. Additionally, the relatively high capacitance values that are thereby achievable in a VLSI chip minimize the chances of alpha-particle-induced errors occurring therein. Also, since a Hi-C capacitor can operate with its upper plate at the potential of the chip substrate, it is not necessary in such an arrangement to provide isolation between memory cells (beyond satisfying a minimum spacing criterion set by the largest depletion width encountered). All of these advantages of a memory cell that include a Hi-C trench capacitor make it possible to achieve high-density cell packing in a high-performance memory array characterized, for example, by relatively low leakage currents, relatively low parasitic capacitances, relatively low sheet resistance and relatively high cell capacitance per unit area.

In principle, the concept of making the aforementioned memory trench capacitors in Hi-C form is therefore extremely attractive. But the attainment of such a Hi-C structure requires controlled doping of steeply sloped trench walls and, heretofore, no completely effective practical procedure for achieving this has been disclosed. Nor has a simple and reliable procedure been devised heretofore for interconnecting the Hi-C trench capacitor of a memory cell with its associated adjacent transistor. It was apparent that such a fabrication procedure, if developed, would constitute a significant contribution to the realization of very-high-bit-capacity VLSI DRAM arrays.

SUMMARY OF THE INVENTION

Hence, an object of the present invention is an improved VLSI DRAM array. More specifically, an object of this invention is a method for fabricating a VLSI DRAM array of the type whose memory cells include Hi-C trench capacitors.

Briefly, these and other objects of the present invention are realized in a specific illustrative embodiment thereof that comprises a Hi-C trench capacitor formed in a silicon substrate. In one particular version, one plate of the trench capacitor comprises a shallow highly doped n region directly underlying the walls of the trench. Advantageously, doping of this n+ region is accomplished by rapidly oxidizing a doped polycrystalline silicon layer previously formed on the trench walls.

Prior to the indicated trench doping, a selected portion of the silicon surface immediately adjacent the trench is purposely exposed. As a result, laterally extending surface portions of the silicon are also doped to form n+ regions during the aforementioned plate formation step. These regions, which constitute conductive lateral extensions of the n+ capacitor plate, allow direct contact to be easily made between this plate of the trench capacitor and a subsequently fabricated adjacent transistor.

Hi-C trench capacitors fabricated in accordance with a process sequence that includes the aforespecified unique steps constitute advantageous components of a VLSI DRAM array. Such capacitors permit the realization of high-performance extremely small-cell-size memories.

BRIEF DESCRIPTION OF THE DRAWING

A complete understanding of the present invention and of the above and other features and advantages thereof may be gained from a consideration of the following detailed description presented hereinbelow in connection with the accompanyng drawing, not drawn to scale, in which.

DETAILED DESCRIPTION

By way of example, the particular VLSI DRAM array to be described below includes memory cells each comprising a single n-channel metal-oxide-semiconductor (NMOS) transistor and an associated Hi-C trench capacitor. For one-micrometer ($\mu$m) design rules, with approximately 0.25 $\mu$m alignment tolerances, each cell measures only about 4.25 $\mu$m by 2.5 $\mu$m on the surface of a silicon chip whose total memory array surface area approximates 0.425 square centimeters. A chip area of this size is thus capable of having defined therein a 4-megabit memory array composed of such small-area cells.

Although emphasis in the description below will be primarily on making Hi-C trench capacitors in a p-doped region for connection to associated NMOS transistors, it is to be understood that the described fabrication procedure is also applicable to making Hi-C trench capacitors in an n-doped region for connection to associated PMOS transistors. Additionally, if desired, memory arrays of the general type specified below may also therefore be fabricated in complementary-MOS (CMOS) technology.

Figure 1:
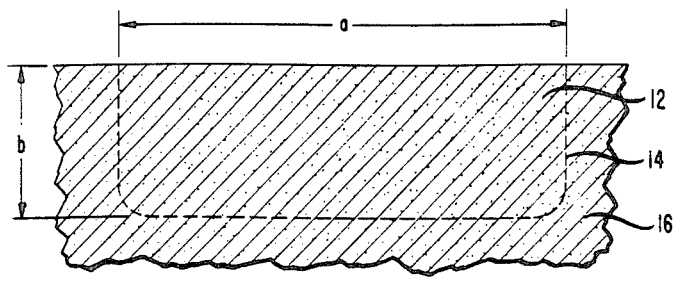
FIGS. 1 through 11 are schematic representations of a portion of a VLSI DRAM memory array at successive stages of a specific illustrative fabrication sequence that embodies the principles of the present invention.

FIG. 1 is a cross-sectional representation of a portion of a VLSI DRAM silicon chip. Illustratively, a p-doped (for example, boron-doped) tub 12 designated by dashed line 14 is shown formed in a p-type bulk substrate 16. (Alternatively, the p-tub 12 may be formed to extend vertically through a surface p-type epi layer into an underlying p+ substrate.) The dimensions $\underline{a}$ and $\underline{b}$ of the indicated tub 12 are, for example, about 3.5 $\mu$m and 5-to-7 $\mu$m, respectively. The concentration $N_s$ of impurities at the surface of the p-tub 12 is given approximately by: $15E16 \leq N_s \leq 2E17$. At the depth $\underline{b}$, the concentration $N_b$ of impurities in the tub region is about $\geq 1e16$. As indicated in detail below, two Hi-C trench capacitors each having a capacitance of about 40-to-55 femtofarards will be formed in the tub 12.

Figure 2:
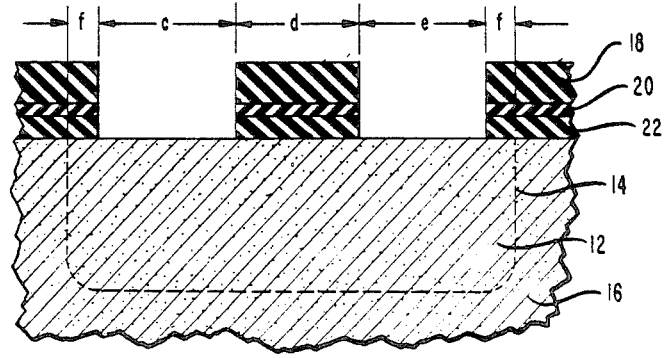

In a series of standard processing steps, a three-layer masking pattern definitive of the trenches to be etched in the tub 12 is formed on the top surface of the depicted structure, as indicated in FIG. 2. Layers 18, 20 and 22 respectively comprise, for example: a 10,000-Angstrom-unit (Å)-thick layer of tetraethylorthosilicate (TEOS), a 1200-Å-thick layer of silicon nitride ($Si_3N_4$) and a 3400-Å-thick layer of silicon dioxide ($SiO_2$). Illustratively, the dimensions $\underline{c}$, $\underline{d}$ and $\underline{e}$ shown in FIG. 2 are each approximately 1 $\mu$m. In practice, the alignment tolerance $\underline{f}$ represented in FIG. 2 is, for example, about 0.25 $\mu$m.

Figure 3:
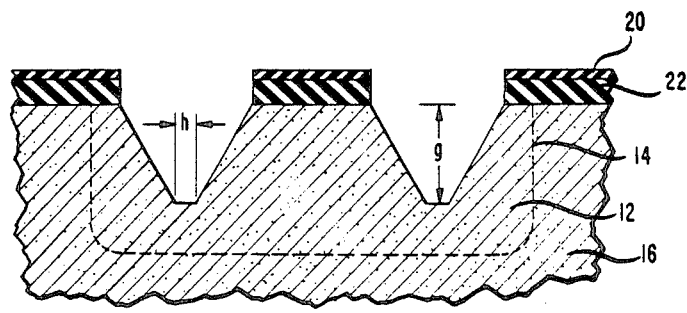

Next, as represented in FIG. 3, two trenches are formed in unmasked portions of the p-tub 12. By way of example, each trench is square (1 $\mu$m by 1 $\mu$m) in cross-section at the surface of the substrate 16 and is about 4-to-6 $\mu$m deep (dimension $\underline{g}$). The width $\underline{h}$ at the bottom of each trench is, for example, approximately 0-to-0.5 $\mu$m.

Illustratively, the trenches shown in FIG. 3 are formed in a standard reactive ion (or sputter) etching (RIE) step utilizing a plasma derived from a reactive chlorine species. Subsequently, any remaining portion of the TEOS layer 18 (FIG. 2) is removed from the structure in another standard RIE step utilizing a plasma derived from $CHF_3$. The resulting structure, including only the masking layers 20 and 22 is depicted in FIG. 3.

Figure 4:
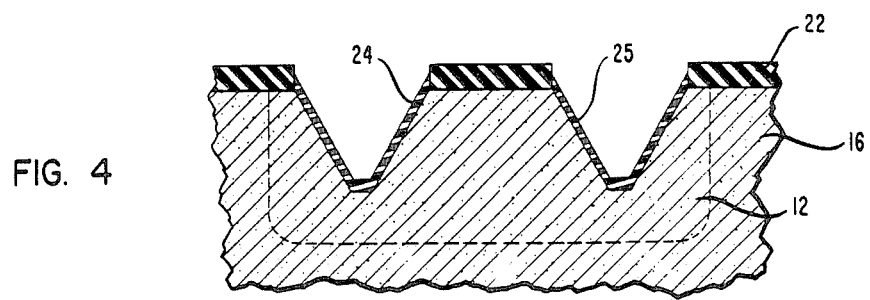

To achieve good quality capacitors, it is advantageous to clean the surfaces of the walls of the trenches shown in FIG. 3. This is done, for example, in a sequence that includes thermally growing a so-called sacrificial layer of silicon dioxide about 400 Å thick on the trench surfaces. The silicon nitride layer 20 is then removed from the device structure in a standard etching step employing, for example, hot phosphoric acid. At that point in the processing sequence, the structure appears as shown in FIG. 4. The aforementioned sacrificial oxide layers formed on the surfaces of the left- and right-hand trenches of FIG. 4 are respectively designated by reference numerals 24 and 25. The depicted structure also includes the previously formed relatively thick silicon dioxide layer 22.

In accordance with the principles of the present invention, the device structure shown in FIG. 4 is then etched. This is done in, for example, a standard wet etching step utilizing a buffered hydrofluoric acid solution. In this step, the sacrificial oxide layers 24 and 25 are totally removed thereby exposing clean trench surfaces. In addition, the oxide layer 22 is selectively modified. In particular, the layer 22 is both thinned and etched back a prescribed amount from the edges of the trenches. The etch-back process exposes surface portions of the chip for subsequent doping.

Figure 5:
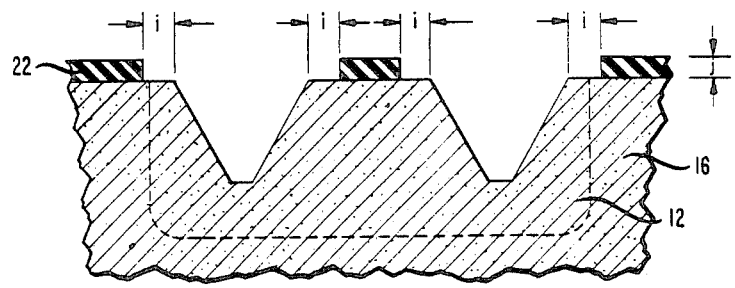

FIG. 5 shows the structure after the aforedescribed etching step. Illustratively, the amount $\underline{i}$ of the etch-back from the edges of the trenches is approximately 3000 Å and the remaining thickness $\underline{j}$ of the oxide layer 22 is about 400 Å. In particular, the remaining thickness of the layer 22 is selected to be sufficient to block subsequently introduced dopants from penetrating into the underlying silicon.

The etch-back step exposes specified surface regions of the chip depicted in FIG. 5. In subsequent steps, these exposed surface regions are doped to provide laterally extending conductive portions designed to establish contact with adjacent transistors, as set forth in detail later below.

Next, capacitor plates comprising doped trench regions are formed in the herein-described device structure. At the same time, the aforementioned laterally extending conductive contact portions are formed in exposed surface regions of the structure. Advantageously, these doped regions are formed in accordance with the unique procedure described in U.S. Pat. Nos. 4,471,524 and 4,472,212.

In accordance with the procedure described in the aforecited patents, extremely shallow highly doped regions are established in the structure specified herein. Illustratively, this is done, as will be set forth in more detail below, by forming a doped polysilicon layer in contact with preselected areas of the silicon surface. This layer is then completely oxidized at a rate that exceeds the rate at which the dopant diffuses in the underlying silicon. As a result, the dopant is driven into the slicon to form an extremely shallow layer characterized by a high dopant concentration. Within each trench, this doped layer constitutes one plate of a so-called Hi-C capacitor.

Figure 6:
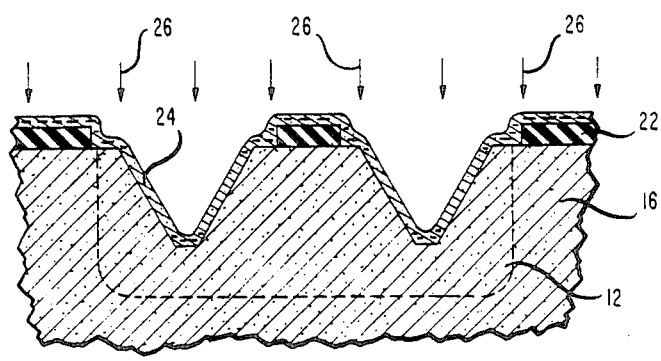

More specifically, the first step in the aforementioned doping process comprises depositing a layer 24 of polysilicon about 500 Å thick on the entire top surface of the structure depicted in FIG. 6. This is done, for example, in a conventional low-pressure chemical-vapor-deposition step. Doping of the polysilicon layer 24 with a suitable n-type impurity such as arsenic can be done either in-situ at the time of deposition or after the polysilicon has been deposited. In-situ doping typically involves the use of a highly toxic gas. Therefore, for illustrative purposes, doping after deposition will be emphasized herein.

Doping of the deposited polysilicon layer 24 (FIG. 6) is carried out, for example, in a standard ion implantation step. Arsenic ions, represented by arrows 26, are directed at the entire top surface of the FIG. 6 structure at an energy of about 30 kilo-electron-volts and at a dose of approximately 3E15 ions per square centimeter. Arsenic ions thereby introduced into the layer 24 are denoted by minus signs.

In practice, the arsenic ions implanted into the polysilicon layer 24 of FIG. 6 are not evenly distributed in the steeply inclined portions of this layer on the trench sidewalls. But, since the lateral diffusivity of arsenic in polysilicon is relatively high, an anneal for about 50-to-60 minutes at 950-to-1050 degrees Celsius is typically effective to achieve substantially uniform distribution of the arsenic ions within the entire extent of the layer 24. To further enhance the diffusivity of arsenic, it is advantageous in some cases to form a silicide (for example, a 200-Å-thick film of tantalum silicide) on the polysilicon layer 24 before carrying out the annealing step.

Next, in accordance with the procedure described in the aforecited patents, the doped polysilicon layer 24 is oxidized in a wet ambient such as steam. (If an overlying metallic silicide layer was formed on the layer 24, it may be necessary in some cases to remove the silicide layer prior to this oxidation step. For certain silicides, however, such removal prior to the oxidation step is not necessary.) The oxidation step converts the layer 24 to silicon dioxide and transfers dopant from the layer 24 into shallow underlying portions of the silicon substrate. Illustratively, this conversion and transfer step is carried out at about 950 degrees Celsius for approximately 20 minutes. Consequently, the doped polysilicon layer 24 is converted to a silicon dioxide layer 27, which is shown in FIG. 7.

As a result of the aforedescribed step, shallow highly doped n+ layers 28 and 29 (FIG. 7) are formed in the herein-specified device structure. Initially, the thickness $\underline{k}$ of these layers is, for example, only about 500 Å. After subsequent standard heating steps carried out in the device fabrication sequence, the layer thickness is typically approximately 1000 Å. Significantly, the sheet resistance of the layers 28 and 29 as finally defined is relatively low, for example, only about 100 ohms per square or less.

Major portions of the extents of the n+ layers 28 and 29 (FIG. 7) exist in the p-tub 14. These major portions each constitute an n+ capacitor plate bounded by the above-specified p-doped tub regions. Such a configuration provides a basis for high-capacitance trench capacitors and enables the spacing between such capacitors to be relatively small. Moreover, as noted above, the highly doped layers 28 and 29 exhibit an advantageously low sheet resistance.

Figure 7:
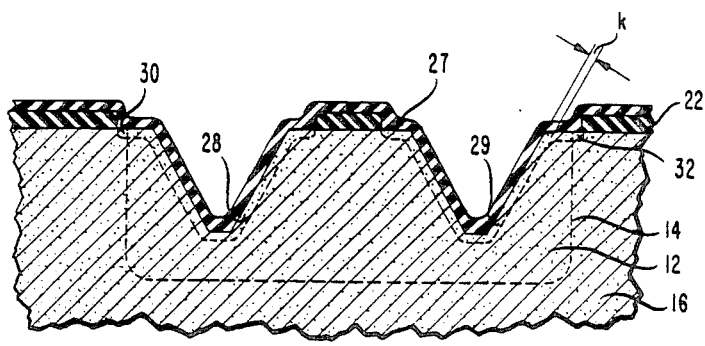

Other portions 30 and 32 of the n+ layers extend to the edges of the previously etched-back oxide layer 22, as shown in FIG. 7. These conductive portions provide accessible contact regions for connection to associated adjacent transistors, as will be described in detail later below.

Figure 8:
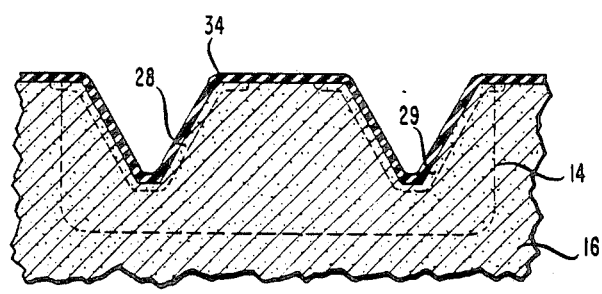

Subsequently, the silicon dioxide layers 22 and 27 shown in FIG. 7 are removed. This is done, for example, in a standard wet etching step utilizing hydrofluoric acid. Next, as shown in FIG. 8, a dielectric layer 34 is formed. The layer 34 constitutes the dielectric of the herein-described trench capacitors. Illustratively, the layer 34 comprises thermally grown silicon dioxide about 150-to-175 Å thick. Alternatively, the layer 34 may be made of another suitable dielectric or may be a composite dielectric comprising plural layers made, for example, of silicon dioxide and silicon nitride.

Figure 9:
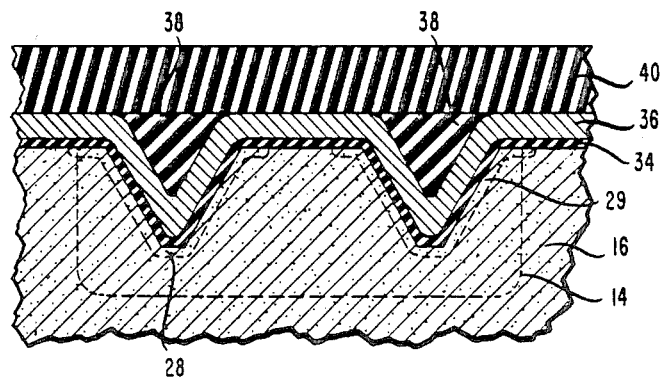

Next, a conducting layer 36 constituting a so-called bias plate of the herein-described Hi-C trench capacitors is formed overlying the entirety of the previously specified dielectric layer 34, as indicated in FIG. 9. In practice, the layer 36 is intended to be electrically connected to the substrate 16 which in a typical memory is connected to a point of reference potential such as ground.

Illustratively, the conductive layer 36 of FIG. 9 comprises a 1000-to-2000-Å-thick layer of p+-doped polysilicon. Doping of the polysilicon layer 36 with a suitable p-type impurity such as boron can be done either in-situ at the time of deposition or by ion implantation after the polysilicon has been deposited. In the latter case, it is advantageous to anneal the doped layer 36 to achieve substantially uniform distribution of the impurity within the entire extent of the layer 36, in the same manner described above for the doped polysilicon layer 24. And, as also described above for the layer 24, it may additionally be advantageous to form a silicide layer on the layer 36 to facilitate distribution of the implanted impurity within the layer 36.

In a conventional manner, the trenches shown in FIG. 9 are then filled with an appropriate dielectric material to the level of the top surface of the doped polysilicon layer 36, as indicated by the fill portions 38. This is done, for example, by forming a thin oxide film (not shown) on the doped polysilicon layer 36, overfilling the trenches by depositing a thick (for example, 1.5-to-2 $\mu$m) undoped polysilicon layer overlying the entire extent of the oxide film and then RIE etching the undoped layer to the level of the top surface of the oxide film. Alternatively, the trenches may be overfilled with a thick layer of a suitable dielectric such as TEOS which is then planarized by etching to form the portions 38.

Subsequently, as shown in FIG. 9, a field-oxide layer 40 of a suitable dielectric material such as TEOS is deposited on top of the doped polysilicon layer 36 and the fill portions 38. By way of example, the layer 40 is typically approximately 3000-to-3500 Å thick.

Next, gate-and-source-and-drain (GASAD) regions are defined in the herein-described device structure. MOS transistors designed to be connected to immediately adjacent Hi-C trench capacitors are formed in these regions.

Figure 10:
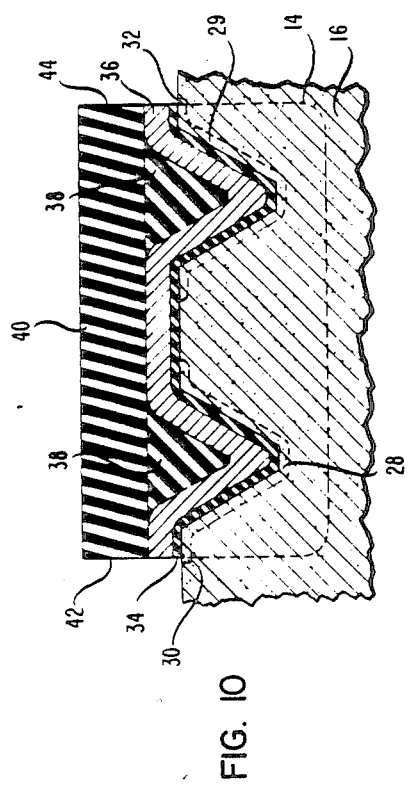

In particular, as shown in FIG. 10, the layers 40, 36 and 34 are anisotropically etched to define vertical sides 42 and 44 of GASAD regions adjacent to the two herein-specified Hi-C trench capacitors. Importantly, the alignment tolerance between these defined GASAD regions and the indicated trenches is sufficiently precise to ensure that subsequently formed n+ source/drain regions of adjacent transistors will contact the laterally extending n+ contact portions 30 and 32 shown in FIG. 10. More specifically, in one specific illustrative embodiment made in accordance with the principles of applicant's invention, the distance between the side 42 and the left-most extent of the portion 30 and the distance between the side 44 and the right-most extent of the portion 32 are each designed to be greater than zero but typically less than 500 Å. (Even if these distances are each zero, lateral diffusion of dopants during subsequent processing will ensure good electrical contact between the source/drain regions and the laterally extending surface portions 30 and 32.)

In subsequent processing steps, standard MOS transistors, each designed to be a component of a memory cell comprising a single transistor and an associated Hi-C trench capacitor, are formed in the substrate 16. Several representative such transistors are schematically indicated in FIG. 11 which shows two complete memory cells of a VLSI array.

Figure 11:
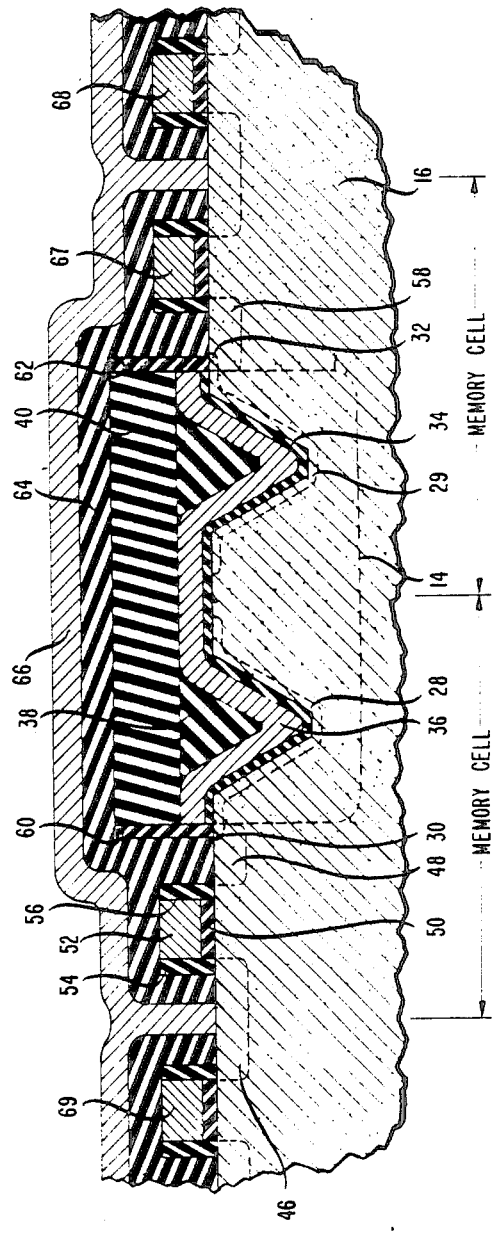

The left-hand memory cell shown in FIG. 11 comprises an MOS transistor that includes n+ source/drain regions 46 and 48, gate oxide layer 50, gate electrode 52 and sidewall oxide layers 54 and 56. Significantly, the n+ region 48 is easily formed to overlap and encompass a substantial part of the laterally extending conductive portion 30. In that way, a reliable electrical connection is made between the n+ region 48 and the n+ layer 28 that constitutes one plate of the left-hand Hi-C capacitor included in the tub 14.

The right-hand memory cell shown in FIG. 11 is identical to the aforedescribed left-hand one. As indicated in FIG. 11, the right-hand MOS transistor includes n+ source/drain region 58. This region is connected via laterally extending conductive portion 32 to the n+ layer 29 of the right-hand Hi-C trench capacitor formed in the tub 14. In that way, the MOS transistor of the right-hand memory cell is electrically connected to one plate of its associated Hi-C trench capacitor.

The specific illustrative memory array schematically represented in FIG. 11 also includes sidewall oxide layers 60 and 62, dielectric layer 64 and conductive layer 66. In this array, the gate electrode 52 and other depicted gate electrodes 67 through 69 are each made of standard gate electrode material(s) utilized in fabricating integrated-circuit devices. Illustratively, each gate electrode is a composite structure comprising doped polysilicon having an overlying layer of a metallic silicide. These gate electrodes constitute word lines. Additionally, the layer 66 is, for example, made of aluminum and constitutes a bit line of the array. In this particular arrangement, each cell shares a bit-line contact with a neighboring cell. And, of course, as previously described, each p-tub of the array is shared by two trench capacitors.

Each of the herein-specified trench capacitors included in a single memory cell comprises in effect two capacitors connected in parallel. Thus, for example, one of the capacitors connected to the n+ region 48 of FIG. 11 comprises the n+ layer 28, the dielectric layer 34 and the p+ layer 36 which is connected to the substrate 16. The other capacitor connected to the n+ region 48 comprises the effective capacitance of the n+-p junction formed by the n+ layer 28 and the p-tub 12 which, of course, is also electrically connected to the substrate 16. In turn, the substrate is connected to a point of reference potential such as ground.

Illustratively, the p+ bias plate or layer 36 of the array shown in FIG. 11 comprises a continuous layer with GASAD openings. By way of example, the aforementioned electrical connection between the layer 36 and the substrate 16 is made at some suitable point of the device structure physically removed from the trench capacitors of the array. Significantly, because the layer 36 is electrically connected to the substrate, there is no need in the depicted array for isolation between adjacent cells (other than satisfying the minimum dimension set by depletion widths, as discussed earlier above). And, of course, the possibility of shorts between the plate 36 and the substrate, which constitutes a problem in so-called inversion-mode capacitors, is nonexistent in the depicted structure.

Finally, it is to be understood that the above-described structures and processing techniques are only illustrative of the principles of the present invention. In accordance with these principles, numerous modifications and alternatives may be devised by those skilled in the art without departing from the spirit and scope of the invention.

What is claimed is:

1. A method of making a VLSI DRAM device in a semiconductive member, said method comprising the steps of forming trenches in a portion of said member that exhibits a specified conductivity type, said trenches each including walls that extend into the member from a main planar surface thereof, whereby edges are defined where the trench walls meet the main planar surface, masking the entire main planar surface of said member except for limited surface portions that extend a prescribed distance away from said edges, simultaneously introducing dopants of the opposite conductivity type into shallow regions below said surface portions and below said trench wall to form in and adjacent to each trench in said semiconductor member a continuous conductive layer that comprises a conductive trench layer and a conductive laterally extending surface extension thereof, and forming an associated MOS transistor, including source and drain regions, in said same semiconductive member adjacent each trench to establish one region of each such adjacent transistor in electrical contact with a portion of the laterally extending extension of the adjacent trench layer, wherein said masking step comprises forming a relatively thick layer on the entire main planar surface of said member and a relatively thin layer on the walls of said trenches, and then etching said layers to remove said relatively thin layer from the walls of said trenches and to pattern said relatively thick layer to form a relatively thin masking layer that covers the entire main planar surface of said member except for said limited surface portions.

* * * * *